United States Patent [19]

Salour et al.

[11] Patent Number: 4,580,269
[45] Date of Patent: Apr. 1, 1986

[54] OPTICALLY PUMPED CW SEMICONDUCTOR RING LASER

[75] Inventors: Michael M. Salour, La Jolla, Calif.; Adrian Fuchs, Cham, Switzerland; Dick Bebelaar, Amsterdam, Netherlands

[73] Assignee: The United States of America as represented by the Secretary of the Air Force, Washington, D.C.

[21] Appl. No.: 552,554

[22] Filed: Nov. 16, 1983

[51] Int. Cl.[4] .................. H01S 3/091; G01C 19/64
[52] U.S. Cl. .................................. 372/94; 356/350; 372/36; 372/43; 372/70
[58] Field of Search ............... 372/34, 70, 94, 43, 372/35, 36, 20, 92; 356/350

[56] References Cited

U.S. PATENT DOCUMENTS

| 4,405,236 | 9/1983 | Mitsuhashi et al. | 356/350 |
| 4,461,006 | 7/1984 | Salour et al. | 372/35 |
| 4,462,103 | 7/1984 | Salour et al. | 372/35 |

OTHER PUBLICATIONS

Green et al, "Traveling-Wave Operation of a Tunable CW Dye Laser," *Optics Communications*, vol. 7, No. 4, Apr. 1973, pp. 349–350.
Jarrett et al, "High-Efficiency Single Frequency CW Ring Dye Laser," *Optics Letters*, vol. 4, No. 6, Jun. 1976, pp. 176–178.
Roxlo et al, "Optically Pumped Semiconductor Platelet Lasers," *IEEE Journal of Quantum Electronics*, vol. QE-18, No. 3, Mar. 1982, pp. 338–342.
Rotman et al, "Pulse-Width Stabilization of a Synchronously Pumped Mode-Locked Dye Laser," *Appl. Phys. Lett.*, 36(11), Jun. 1, 1980, pp. 886–888.
Roxlo et al, "Tunable CW Bulk Semiconductor Platelet Laser," *Appl. Phys. Lett.*, vol. 38, No. 7, Apr. 1, 1981, pp. 507–509.
Roxlo et al, "Synchronously Pumped Mode-Locked CdS Platelet Laser," *Appl. Phys. Lett.*, vol. 38, No. 10, May 15, 1981, pp. 738–740.
Roxlo et al, "Dewar Design for Optically Pumped Semiconductor Laser," *Review of Sci. Instr.*, vol. 53, No. 4, Apr. 1982, pp. 458–460.
Fuchs et al, "Optically Pumped CW Semiconductor Ring Laser," *Appl. Phys. Lett.*, vol. 43, No. 1, Jul. 1, 1983, pp. 32–34.

*Primary Examiner*—James W. Davie
*Attorney, Agent, or Firm*—Donald J. Singer; Jacob N. Erlich

[57] ABSTRACT

An optically pumped semiconductor ring laser having a plurality of reflective elements optically aligned with one another to form a ring-shaped resonant cavity. A semiconductor lasing medium is mounted within the ring-shaped resonant cavity by a transparent, heat conductive mount located within a vacuum/cooling chamber of the type which allows the passage of a laser beam therethrough. A pump beam initiates a lasing action within the ring-shaped resonant cavity to produce said laser beam and said laser beam exits the resonant cavity as a pair of outputs. An alternate embodiment of the above described semiconductor ring laser provides a semblance of unidirectional lasing operation.

22 Claims, 4 Drawing Figures

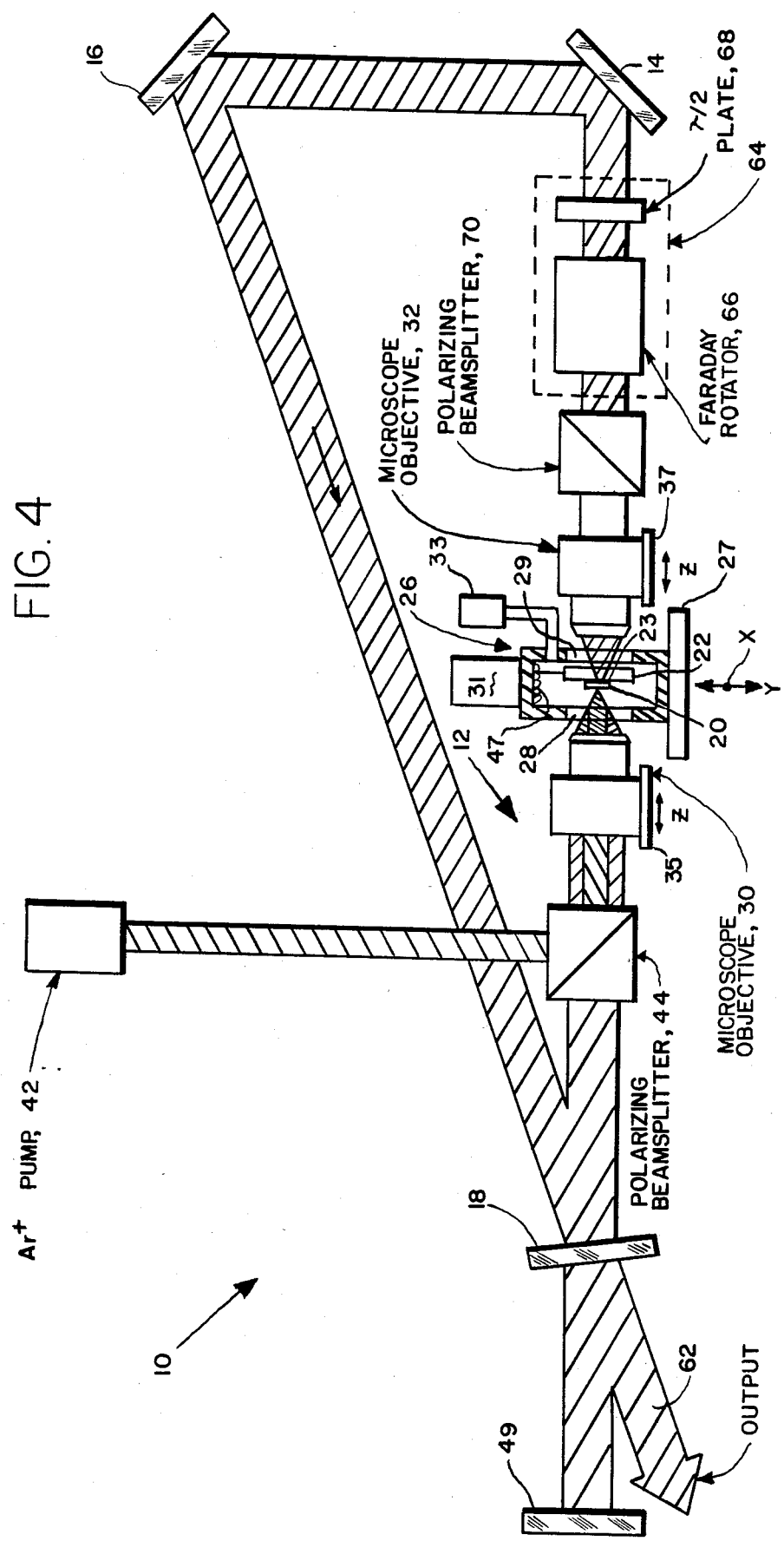

OPTICALLY PUMPED CW SEMICONDUCTOR RING LASER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to semiconductor lasers, and, more particularly, to an optically pumped continuous wave semiconductor ring laser.

Lasers exist in many shapes and forms, yet search for new types of lasers continues unabated. Lasers vary greatly in many aspects such as, for example, power, operating wavelength, cavity design, method of pumping and mode discipline (mode-locking, single-frequency, or chaotic operation). The single, most frequent means of laser identification is by the type of gain medium utilized within the laser, since the medium will strongly influence, if not dictate, the other considerations of laser design.

Optically pumped semiconductor lasers are of especially great interest because of their potential for becoming a convenient, tunable, coherent source of electromagnetic radiation throughout the visible and near IR range of the spectrum. The most distinguishing feature of the semiconductor laser is that it does not deal with gain centers (atoms, ions, molecules, complexes) sparsely distributed in a passive medium or empty space, but rather with the phenomena of inverting the atoms in an entire block of solid material, unlike any other kind of laser. Excellent examples of an optically pumped semiconductor laser can be found in an article by C. B. Roxlo, D. Bebelaar, and M. M. Salour, "Tunable cw bulk semiconductor platelet laser," *Applied Physics Letters*, Vol. 38, No. 7, 1 Apr. 81, pp 507–509 and an article by C. B. Roxlo and M. M. Salour, "Synchronously pumped mode-locked CdS platelet laser," *Applied Physics Letters*, Vol. 38, No. 10, 15 May 81, pp 738–740. The optically pumped semiconductor laser combines the advantage of an increased spectral range over dye lasers with the possibility of intracavity tuning elements not available in diode lasers.

It has also been recognized that ring dye lasers are capable of producing substantial single-frequency output power as well as the shortest duration pulses thus far measurable when mode-locked. An excellent example of such a type of ring dye laser can be found in an article by S. M. Jarrett and J. F. Young, "High-efficiency single-frequency cw ring dye laser," *Optical Letters*, Vol 4, No. 6, June 1979, pgs 176–178. It would therefore appear to be extremely advantageous to combine the benefits provided by the ring laser with those of the optically pumped semiconductor laser. Unfortunately, the utilization of the solid, semiconductor lasing medium in place of the lasing medium found in conventional ring lasers has presented a number of problems heretofore insurmountable.

Generally, prior attempts at producing an optically pumped semiconductor ring laser have led to unacceptable results ranging from unreliable lasing to a complete destruction of the semiconductor lasing material. A major problem associated with such past attempts has been related to the fact that the use of a semiconductor lasing medium as typified in the optically pumped semiconductor laser of, for example, the type described in the above-mentioned articles in *Applied Physics Letters* by one of the present inventors does not obviously lead one to the conclusion that the semiconductor possesses the transparency necessary for ring laser operation. It was generally believed that the properties which allow the semiconductor to be used as a lasing medium in a conventional-type resonant cavity, adversely affect its use in the ring laser. Furthermore, even overcoming the above problem only leads to further problems. For example, the severe heating of the semiconductor lasing medium in a ring resonant cavity which would take place during laser operation can completely destroy the semiconductor itself.

If, however, an optically pumped semiconductor ring laser could be developed, it would appear to have all the advantages of prior semiconductor lasers and, in addition, provide increased power, and ease of operation.

SUMMARY OF THE INVENTION

The present invention overcomes the problems encountered in the past and as set forth in detail hereinabove by providing a continuous wave (cw) optically pumped semiconductor ring laser.

The optically pumped semiconductor ring laser of the present invention incorporates therein a semiconductor lasing medium, prefereably in the form of a cadmium sulfide platelet crystal, which must be capable of transmissive operation, that is, be designed extremely thin, for example, having a thickness of 30 microns or less and which is capable of being pumped by a laser laser is of relatively low power, such as, for example, falling within the 5 mW to 2–3 W power range. Even the above criteria alone is insufficient to provide reliable semiconductor ring laser operation since there must be substantial removal of heat from the semiconductor, a problem not previously encountered to the same extent, even in the operation of prior semiconductor lasers such as set forth in the above-mentioned articles in *Applied Physics Letters* by one of the present inventors.

It is therefore essential that the semiconductor crystal be mounted onto a piece of transparent, substantially nonreflective, optical quality, good heat conducting material. It is further understood that the transparency of the mounting material be transmissive to the wavelength of laser operation. An example of such a mounting material would be a good quality sapphire. The sapphire has its c axis parallel to the axis of the semiconductor crystal in order to prevent depolarization of the laser beam. In addition, it is essential in the present invention that the sapphire as well as the semiconductor lasing medium be located within a cooling chamber which is of such design to allow the appropriate lasing action to take place within the ring-shaped resonant cavity.

The cooling chamber utilized with the present invention is a Dewar-type cooling chamber which has a vacuum and the semiconductor platelet crystal and sapphire mounted therein. A pair of windows, transparent to the wavelength of interest, are formed as part of the cooling chamber and are located juxtaposed opposite sides of the semiconductor platelet. In view of the criticality associated with heat removal from the semiconductor, it may be desirable to actually sandwich the crystal between a pair of heat conducting sapphire elements. Furthermore, in order to provide acceptable focusing and defocusing of the laser beam, there should be virtually no space between the semiconductor/substrate arrangement and the transparent windows. Appropriate positioning of the semiconductor in two directions is required and is accomplished by an xy stage which is affixed to the exterior of the cooling chamber structure.

In view of the transparent nature of the semiconductor crystal it is essential to avoid any obstruction of the optical path through the crystal. Within the cooling chamber, a copper frame, cutout to hold the sapphire mount and semiconductor crystal in place, is operably connected to a suitable cooling reservoir so as to maintain the semiconductor crystal as well as the sapphire substrate or mount at the appropriate temperature of approximately 85 K. In addition, there is an auxilliary heating source located within the cooling chamber in order to achieve a sensitive temperature control of the semiconductor crystal thereby maintaining the temperature of the semiconductor in the range of between approximately 85 K. and 104 K. This temperature control aids in the tuning of the ring laser of this invention.

In addition, a focusing/defocusing means such as a pair of microscope objectives are situated external of the cooling chamber adjacent both windows, respectively, in order to focus the pump beam onto the semiconductor crystal and focus and defocus the laser beam within the resonant cavity of the laser.

A series of reflecting elements are located external of the cooling chamber in optical alignment with each other in order to form the ring-like laser or resonant cavity. One of these reflecting elements is also used in order to output a pair of laser beams produced by the ring laser of the present invention. Consequently, this reflective element has a transmissivity of between 0.5% and 50%. Continuous wave outputs of up to 16 mW in the bidirectional operation of the ring laser of the present invention can be obtained by utilizing an output coupling mirror with 8% transmittance.

In order to operate the optically pumped semiconductor ring laser of the present invention so as to produce a semblance of unidirectional operation and produce a single output beam an optical diode, preferably in the form of the combination of a Faraday rotator and a crystalline quartz half-wave plate, is provided within the resonant cavity. The optical diode provides, for example, a 33% polarization rotation and a differential loss of approximately 0.30. To insure that after rotation the vertically polarized component of the laser beam can be ejected from the cavity, polarizing beam splitters are also placed within the resonant cavity. Tuning of the ring laser of the present invention is accomplished by the utilization of a prism as one of the reflecting surfaces within the resonant cavity and/or the a control of the temperature of the semiconductor crystal located within the cooling chamber.

It is therefore an object of this invention to provide an optically pumped cw semiconductor ring laser.

It is another object of this invention to provide an optically pumped cw semiconductor ring laser which is capable of producing increased output power.

It is still a further object of this invention to provide an optically pumped cw semiconductor ring laser which can be reliably operated.

It is still another object of this invention to provide an optically pumped semiconductor ring laser which incorporates therein a uniquely designed cooling/vacuum chamber.

It is an even further object of this invention to provide an optically pumped cw semiconductor ring laser which is economical to produce and which utilizes conventional, currently available components that lend themselves to standard, mass-producing, manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

Figure 3:
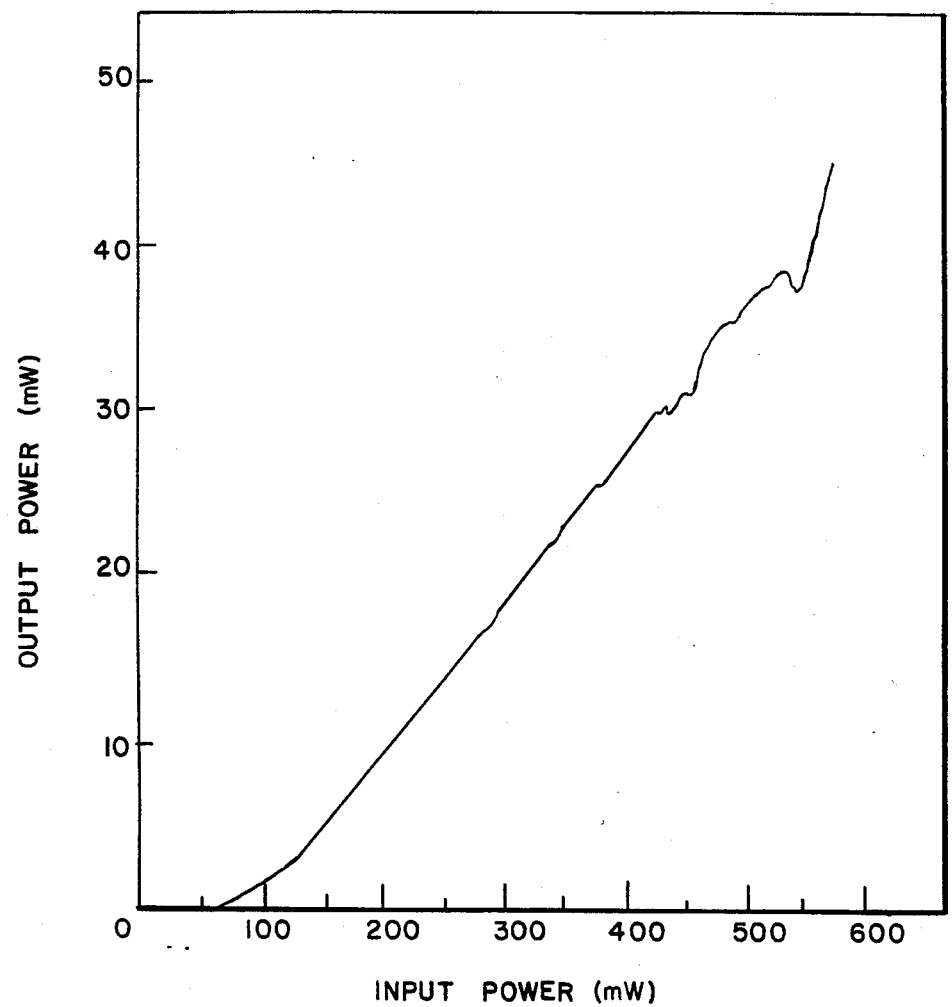

FIG. 3 is a graphic representation of the output power versus the input power trace obtained from the optically pumped cw semiconductor ring laser of this invention with 30% output coupling and back coupling of the second output beam by means of a retroreflecting mirror; and FIG. 4 is a side-elevational view of the optically pumped cw semiconductor ring laser of the present invention incorporating a Faraday-rotator type optical diode within the resonant cavity thereof and shown partially in cross-section and in schematic fashion.

DETAILED DESCRIPTION OF THE PREFERRED EMBODIMENTS

Figure 1:
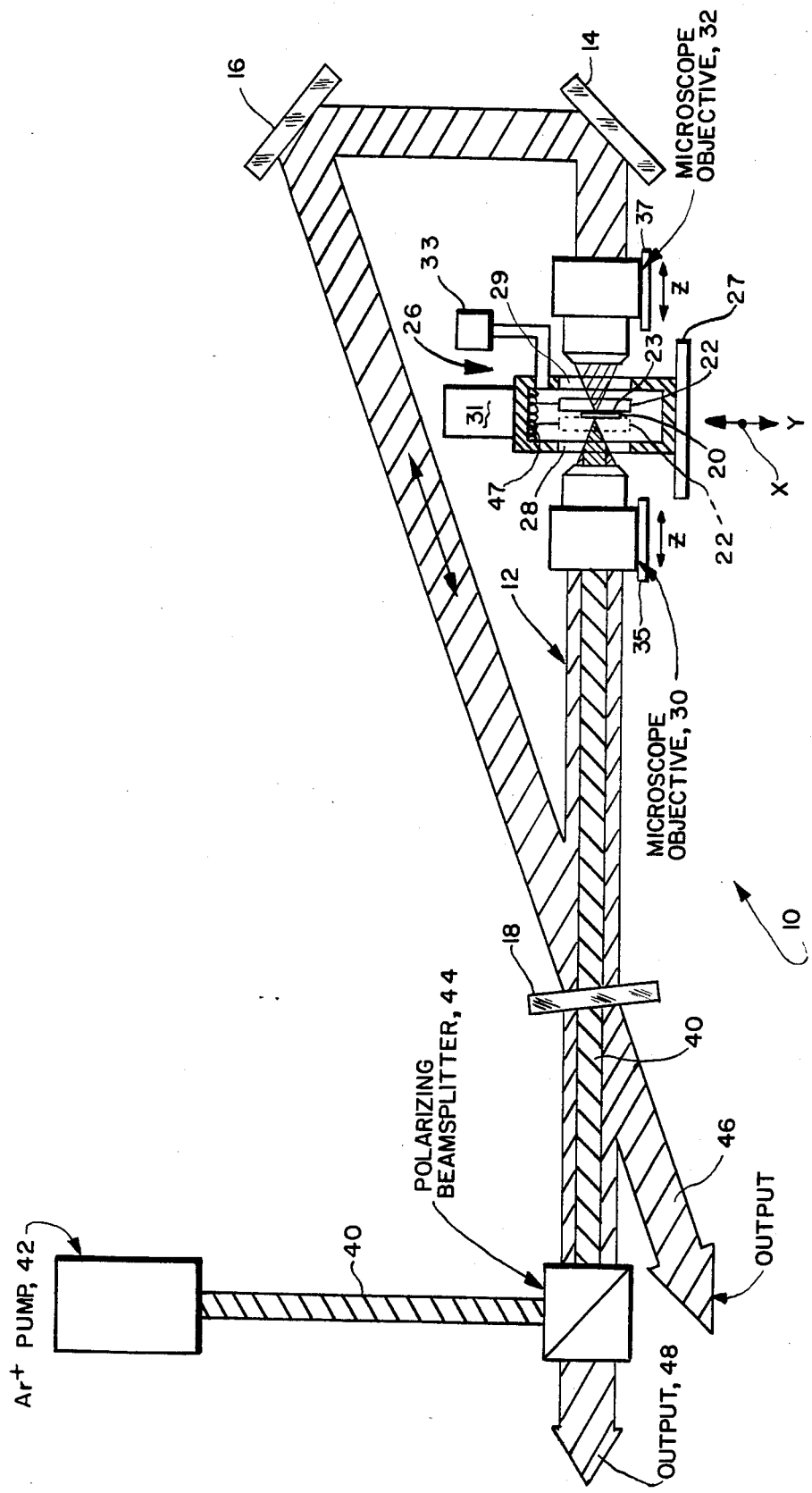
FIG. 1 is a side-elevational view of the optically pumped cw semiconductor ring laser of this invention shown partly in cross-section and in schematic fashion.

Reference is now made to FIG. 1 of the drawing which clearly illustrates in schematic fashion the various components which make up the optically pumped continuous wave (cw) semiconductor ring laser 10 of the present invention. Semi-conductor ring laser 10 of this invention incorporates therein a ring-type resonant cavity 12 which is defined by a plurality of optically aligned reflecting elements such as mirrors 14, 16, and 18. Although the exact number of mirrors which define the ring-type resonant cavity may vary within the scope of this invention, one of these mirrors (18) can be used as an output coupler and therefore should have a transmissivity of between 0.5% and 50%. The other mirrors, 14 and 16, utilized to bound the resonant cavity are generally flat and highly reflective. An example of a typical overall cavity length would be approximately 3.5 meters.

The lasing medium of this invention is made up of a very thin semiconductor platelet crystal 20 such as cadmium sulfide (CdS), Cd $Se_{1-x}$, or $In_{1-x}Ga_x$-$As_yP_{1-y}$ which is preferably less than 30 microns or optimally between 5 to 6 microns in thickness. It is essential that the thickness of semiconductor crystal 20 be thin enough to permit transmission therethrough. The semiconductor crystal 20 is mounted upon an optically transparent, substantially nonreflective, substrate 22, which has extremely good heat conducting properties. An example of a material which meets the above criteria would be sapphire which has an antireflection coating thereon. Crystal 20 is secured to substrate 22 by means of using a thin film of low viscosity silicone oil 23 applied upon substrate 22 adjacent semiconductor crystal 20. The semiconductor crystal 20 is held in place on sapphire substrate 22 by surface tension. The oil layer 23 is often less than 5 micrometers thick and does not crack when cooled. It is essential that the sapphire substrate 22 be transparent to the wavelength of laser operation in order for operation of the ring laser 10 of this invention to take place.

In view of the substantial heat generated in ring laser operation, the sapphire substrate 22 must be adequately cooled. Therefore, it is mounted within a Dewar-type cooling chamber 26 containing a vacuum therein and which meets certain essential criteria set forth below. Cooling chamber 26, for example, may be of the type set forth in U.S. patent application Ser. No. 552,555 filed herewith by two of the present inventors and now U.S. Pat. No. 4,495,782 issued on Jan. 29, 1985 and incorporated herein by reference. Additional heat removal from crystal 20 can be obtained by mounting a second transparent, heat conductive element 22', shown in phantom in the drawing, adjacent the other side of crystal 20. Heat conductive element 22' is also preferably in the form of a slab of sapphire material mounted adjacent crystal 20. In this manner crystal 20 is sandwiched between a pair of heat removing elements which allow the passage of the laser beam therethrough.

The semiconductor crystal/sapphire combination (20, 22) is held in place within vacuum/cooling chamber 26 for movement with the chamber in two directions. This movement includes translational movement along the x, y axes by means of a translational stage 27. Any suitable cooling source such as liquid nitrogen is contained within a coolant reservoir 31 which is operably connected to sapphire substrate 22 (or sapphire 22'). The interior of cooling chamber 26 is maintained evacuated by means of any suitable vacuum pump 33.

In addition, it is essential that the cooling chamber 26 have a pair of windows 28 and 29, prefereably made of glass also transparent to the wavelength of the laser beam passing therethrough. These windows 28 and 29, respectively, are situated in front of and behind the semiconductor crystal platelet 20 so as to allow the passage of electromagnetic radiation therethrough.

Focusing/defocusing means are positioned external of the cooling chamber. The focusing/defocusing means are both in the form of conventional microscope objective 30 and 32 placed in front of the semiconductor crystal 20 and in back of the semiconductor crystal 20, respectively. By mounting microscope objectives 30 and 32 upon movable mounts or stages 35 and 37, respectively, it is possible to move the microscope objectives 30 and 32 along the z axis in order to focus the incoming pump beam onto the semiconductor crystal 20 as well as focus and defocus the intracavity semiconductor laser beam. An example of the microscope objectives 30 and 32 which can be used with the present invention could be a Leitz EF 10/0.25P microscope objective.

The semiconductor lasing medium 20 is optically pumped longitudinally by a laser beam 40 emanating from any suitable pump laser source 42 such as, for example, a continuous wave 476 nm Ar+ laser. Pump beam 40 is directed into the ring resonant cavity 12 by a conventional polarizing beam splitter 44. This polarizing beam splitter 44 is capable of distinguishing between the vertically polarized 476 nm Ar+ pump light 40 and the horizontally polarized output 46 and 48 of the semiconductor laser 10 of this invention. Focusing of the pump beam 40 onto the semiconductor crystal 20 to a spot size of approximately 5 micrometers is accomplished by means of the microscope objective 30. In addition, the microscope objectives 30 and 32 serve to appropriately focus and defocus the bidirectional laser beam within resonant cavity 12.

Figure 2:
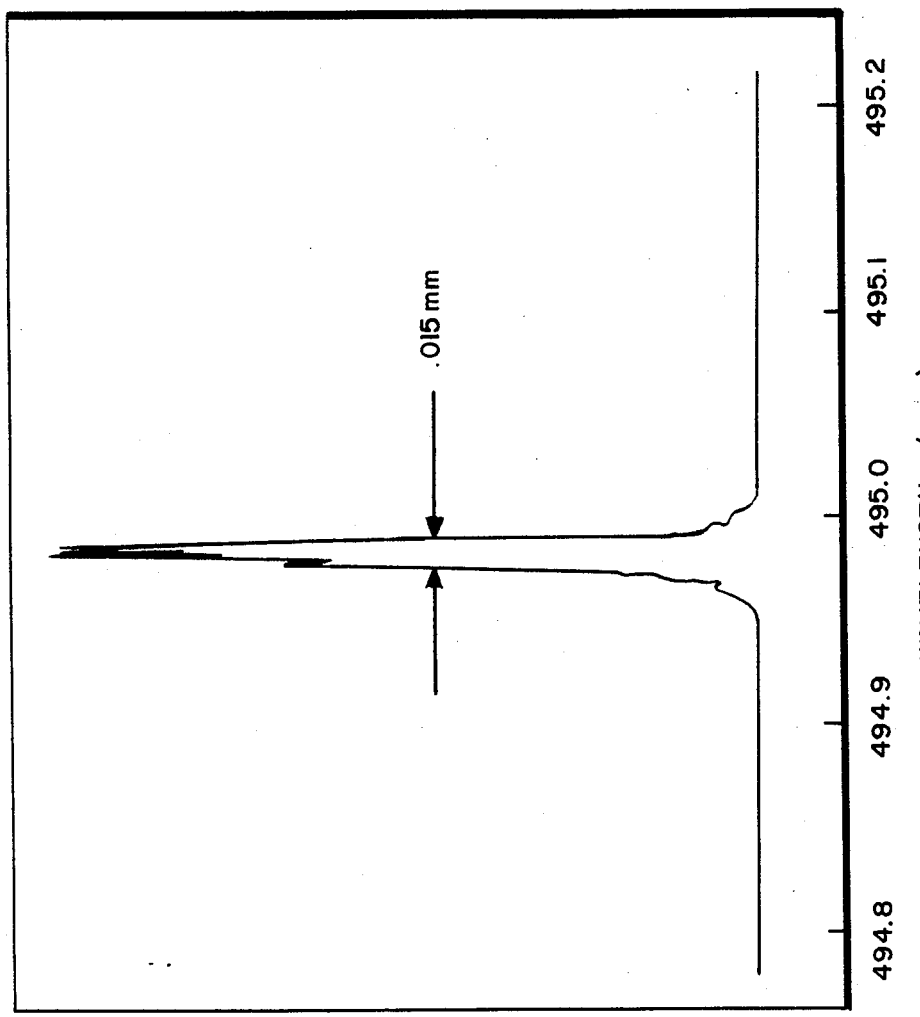
FIG. 2 is a graphic representation of line-width observed without any line-width narrowing elements introduced into the resonant cavity of the optically pumped cw semiconductor ring laser of this invention.

As shown graphically in FIG. 2 of the drawing a line-width as small as approximately 0.015 nm can be obtained with the present invention without any line-width narrowing elements. It should be noted, however, that by the introduction of a prism into the resonant cavity 12 for tuning, this line-width can be reduced even further to approximately 0.006 nm. The prism can be utilized within cavity 12 as a replacement for mirror 14. The full tuning range with such a prism would be 2.5 nm (493.6–496.1 nm). Additional tuning with the present invention can be achieved by changing the temperature of crystal 20 from approximately 85 K. to approximately 140 K. This is accomplished by the provision of a controllable heating element 47 within cooling chamber 26. Such change in temperature can result in varying the wavelength from approximately 494 to 502 nm.

Referring once again to FIG. 1 of the drawing, the outputs 46 and 48 of laser 10 can be obtained through output coupling element 18, which is most instances has a transmittance of 8%. Using an output coupler with a 30% transmittance, for example, a maximum power of 20 mW per beam with a slope efficiency of 15% and a power conversion efficiency of approximately 10% in the $TEM_{oo}$ mode can be accomplished with the present invention. Although, in contrast to conventional dye ring lasers there is no significant increase in the ratios of powers between the two outputs 46 and 48 of semiconductor ring laser 10 of this invention, coupling back one of the beams with a retroreflecting mirror can result in an output power of more than 40 mW in a single output beam. This output power is illustrated graphically in FIG. 3 of the drawing.

In order to illustrate an alternate embodiment of this invention capable of providing such increased output, reference is now made to FIG. 4 of the drawing which depicts schematically an optically pumped semiconductor ring laser 60 in which the ring laser is operated in a manner resembling unidirectionally. It is to be noted that for purposes of ease of understanding of this aspect of the invention, those elements included in laser 60 which are identical to the elements depicted with respect to semiconductor ring laser 10 illustrated in FIG. 1 will be given identical reference numerals. Therefore, the makeup and operation of such elements can be found earlier in the specification with respect to the detailed description of optically pumped semiconductor ring laser 10.

In order to accomplish the single output 62 obtained with ring laser 60, a retroreflecting mirror 49 is utilized and an optical diode 64 is placed within the resonant cavity 12. In the embodiment shown in FIG. 4 of the drawing optical diode 64 is made up of a conventional Faraday rotator 66 in conjunction with a conventional crystaline quartz half-wave plate 68. Such an arrangement, for example, provides a 33% polarization rotation and a differential loss of approximately 0.30. In order to insure that after rotation the vertically polarized component of the laser beam can be ejected from the resonant cavity 12, a polarizing beam splitter 70 is inserted within the resonant cavity 12 between microscope objective 32 and the optical diode 64. In addition, the polarizing beam splitter 44 is placed directly within the ring resonant cavity 12 rather than external thereto as with respect to ring laser 10.

Another unique feature of the semiconductor ring laser 60 of the present invention resides in the fact that the Fabry-Perot etalon formed by the faces of the semiconductor crystal 20 are capable of providing an optical diode effect by itself. This effect is produced by the unequal reflectivities of the two faces of the crystal 20, combined with the gain in the medium between. The reflectivities (for example, approximately 0.21 and 0.06) are unequal because of the asymmetrical mounting of the crystal itself. It should be noted, however, that this asymmetry would be eliminated if a second sapphire element 22' were used. With the sandwiched crystal as shown in FIG. 1, the mounting of crystal 20 would be considered symmetrical.

The differential reflection loss between the two surfaces of the Fabry-Perot can be as high as 0.50 with a net gain in crystal 20 of 1.8 with virtually no reflection for the counterclockwise propagating beam. In fact, it was found that the optical diode effect formed by the Fabry-Perot of crystal 20 was stronger than the effect created by optical diode 64 formed by the Faraday rotator 66 and the half-wave plate 68. A ratio between the counterclockwise and clockwise beam intensity as high as 5 can be obtained when both optical diode effects are utilized within the resonant cavity 12 of ring laser 60 depicted in FIG. 4 if ring laser 60 was set to favor the counterclockwise beam illustrated by the arrow in FIG. 4. The ratio was decreased to 2 when the preferred direction of the Fabry-Perot diode was reversed. Under all circumstances, however, the lasing threshold for the clockwise and the counterclockwise beams was exactly the same, as was the wavelength.

Although this invention has been described with reference to particular embodiments, it will be understood that this invention is also capable of further and other embodiments within the spirit and scope of the apended claims. For example, although an Ar+ laser 42 is generally utilized as the pumping laser, lasing could also be accomplished with the 488-, 473-, and 458-nm lines, pumping even 200 meV above the bandgap with the Cds crystal is possible without absorption-depth problems.

It is further possible with this invention to extend the use of semiconductor ring lasers 10 and 60 to a variety of other semiconductor elements such as, for example, CdSe,CdSSe and InGaAsP crystals using a 514-nm Ar+ pump or other pump sources such as a Kr+ laser. Furthermore, several crystals can be mounted adjacent each other on the same sapphire substrate 22 thereby yielding a ring laser easily tunable from 500 to near infrared.

We claim:

1. An optically pumped semiconductor ring laser comprising:
   a ring-shaped resonant cavity defined by a plurality of optically aligned reflective elements, one of said reflective elements being partially transmissive in order to permit the passage of a laser beam therethrough;
   a semiconductor lasing medium mounted within said ring-shaped resonant cavity;
   means for mounting said semiconductor lasing medium within said ring-shaped resonant cavity in such a manner to permit the passing of said laser beam through said semiconductor lasing medium;
   means for providing a vacuum and temperature controlled environment surrounding said semiconductor lasing medium, said vacuum and temperature controlling means permitting the passage of said laser beam therethrough;
   means for providing a beam of electromagnetic radiation for pumping said semiconductor lasing medium of said ring laser;
   means for directing said pump beam into said ring-shaped resonant cavity;
   focusing/defocusing means optically aligned with said semiconductor lasing medium for focusing said pump beam onto said lasing medium and for focusing said laser beam onto said semiconductor lasing medium and for defocusing said laser beam exiting from said semiconductor lasing medium;
   whereby said pump beam initiates a lasing action within said ring-shaped resonant cavity to produce said laser beam, said laser beam producing a pair of outputs, said outputs exiting from said resonant cavity through said partially transmissive reflective element of said ring-shaped resonant cavity.

2. An optically pumped semiconductor ring laser as defined in claim 1 wherein said vacuum and temperature controlling means comprises a housing forming a chamber therein, said housing having a pair of windows, each of said windows being adjacent opposite sides of said semiconductor lasing medium.

3. An optically pumped semiconductor ring laser as defined in claim 2 wherein said focusing/defocusing means is positioned external to said vacuum and temperature controlling means.

4. An optically pumped semiconductor ring laser as defined in claim 1 wherein said means for mounting said semiconductor lasing medium comprises a substantially nonreflective heat conductive element transparent to the wavelength of laser operation, said heat conductive element being located within said vacuum and temperature controlling means adjacent one side of said semiconductor lasing medium.

5. An optically pumped semiconductor ring laser as defined in claim 4 wherein said vacuum and temperature controlling means comprises a housing forming a chamber therein, said housing having a pair of windows, each of said windows being adjacent opposite sides of said semiconductor lasing medium.

6. An optically pumped semiconductor ring laser as defined in claim 5 wherein said vacuum and temperature controlling means includes a coolant source, said coolant source being operably connected to said heat conductive element mounting said semiconductor lasing medium.

7. An optically pumped semiconductor ring laser as defined in claim 6 wherein said vacuum and temperature controlling means further includes means for controllably heating said semiconductor lasing medium in order to provide a tuning capability to said ring laser.

8. An optically pumped semiconductor ring laser as defined in claim 7 further comprising another heat conductive element adjacent the other side of said semiconductor lasing medium, said other heat conductive element being transparent to the wavelength of laser operation.

9. An optically pumped semiconductor ring laser as defined in claim 3 wherein said vacuum and temperature controlling means includes means for moving said vacuum and temperature controlling means along two axes and said focusing/defocusing means includes means for moving said focusing/defocusing means along a third axis.

10. An optically pumped semiconductor ring laser as defined in claim 9 wherein said means for directing said pump beam into said resonant cavity is located external of said ring-shaped resonant cavity.

11. An optically pumped semiconductor ring laser as defined in claim 10 wherein said focusing/defocusing means comprises a pair of microscope objectives, each of said microscope objectives mounted adjacent a different one of said windows, respectively.

12. An optically pumped semiconductor ring laser as defined in claim 11 wherein said means for mounting said semiconductor lasing medium comprises a substantially nonreflective heat conductive element transparent to the wavelength of laser operation, said heat conductive element being located within said vacuum and temperature controlling means adjacent one side of said semiconductive lasing medium.

13. An optically pumped semiconductor ring laser as defined in claim 12 wherein said semiconductor lasing medium comprises a cadmium sulfide crystal having a thickness of between 5 and 6 microns.

14. An optically pumped semiconductor ring laser as defined in claim 12 wherein said heat conductive mounting means comprises a sapphire substrate.

15. An optically pumped semiconductor ring laser as defined in claim 1 further comprising means for retroreflecting one of said outputs from said ring laser back into said resonant cavity and means for producing an optical diode effect within said resonant cavity whereby said laser beam of said ring laser provides a semblance of unidirectionality.

16. An optically pumped semiconductor ring laser as defined in claim 15 wherein said means for producing said optical diode effect comprises a Faraday rotator and a crystalline half-wave plate.

17. An optically pumped semiconductor ring laser as defined in claim 16 wherein said focusing/defocusing means includes a pair of microscope objectives, and said ring laser further comprises a polarizing beamsplitter interposed within said ring-shaped resonant cavity one of said microscope objectives and said Faraday rotator.

18. An optically pumped semiconductor ring laser as defined in claim 17 wherein said means for directing said pump beam into said cavity is in the form of a polarizing beam splitter located within said ring-shaped resonant cavity.

19. An optically pumped semiconductor ring laser as defined in claim 15 wherein said vacuum and temperature controlling means comprises a housing forming a chamber therein, said housing having a pair of windows, each of said windows being adjacent opposite sides of said semiconductor lasing medium.

20. An optically pumped semiconductor ring laser as defined in claim 19 wherein said means for mounting said semiconductor lasing medium comprises a substantially nonreflective heat conductive element transparent to the wavelength of laser operation, said heat conductive element being located within said vacuum and temperature controlling means adjacent one side of said semiconductor lasing medium.

21. An optically pumped semiconductor ring laser as defined in claim 20 wherein said vacuum and temperature controlling means further includes means for controllably heating said semiconductor lasing medium in order to provide a tuning capability to said ring laser.

22. An optically pumped semiconductor ring laser as defined in claim 21 wherein said vacuum and temperature controlling means includes means for moving said vacuum and temperature controlling means along two axes and said focusing/defocusing means includes means for moving said focusing/defocusing means along a third axis.

* * * * *